US011608289B2

(12) United States Patent
Magdenko-Savourey

(10) Patent No.: US 11,608,289 B2
(45) Date of Patent: Mar. 21, 2023

(54) COLOURED GLAZING AND METHOD FOR OBTAINING SAME

(71) Applicant: SAINT-GOBAIN GLASS FRANCE, Courbevoie (FR)

(72) Inventor: Liubov Magdenko-Savourey, Montigny le Bretonneux (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 558 days.

(21) Appl. No.: 16/608,067

(22) PCT Filed: Apr. 27, 2018

(86) PCT No.: PCT/FR2018/051075
§ 371 (c)(1),
(2) Date: Oct. 24, 2019

(87) PCT Pub. No.: WO2018/197821
PCT Pub. Date: Nov. 1, 2018

(65) Prior Publication Data
US 2020/0189959 A1 Jun. 18, 2020

(30) Foreign Application Priority Data

Apr. 28, 2017 (FR) ...................................... 1753796

(51) Int. Cl.
C03C 1/00 (2006.01)
C03C 17/00 (2006.01)
(Continued)

(52) U.S. Cl.
CPC ............ *C03C 1/008* (2013.01); *C03C 17/002* (2013.01); *C03C 17/007* (2013.01);
(Continued)

(58) Field of Classification Search
CPC .................................................. C03C 17/3694
See application file for complete search history.

(56) References Cited

U.S. PATENT DOCUMENTS 5,942,331 A 8/1999 Miyauchi et al.
2007/0087187 A1* 4/2007 Lu .......................... C23C 16/44
427/205
(Continued)

FOREIGN PATENT DOCUMENTS

GB 2126256 A * 3/1984 ....... B32B 17/10174
JP 03-187733 A 8/1991
(Continued)

OTHER PUBLICATIONS

Anatase Mineral Data, webmineral.com (Year: 2016).*
(Continued)

*Primary Examiner* — David Sample
(74) *Attorney, Agent, or Firm* — Oblon, McClelland, Maier & Neustadt, L.L.P.

(57) ABSTRACT

A glazing includes a glass substrate on which is deposited a coating including at least one layer, the layer being formed from a material including metal nanoparticles dispersed in an inorganic matrix of an oxide, in which the metal nanoparticles are made of a metal chosen from the group formed by silver, gold, platinum, copper and nickel or of an alloy formed from at least two of these metals, in which the matrix including an oxide of at least one element chosen from the group of titanium, silicon and zirconium and in which the atomic ratio M/Me in the material is less than 1.5, M representing all atoms of the elements of the group of titanium, silicon and zirconium present in the layer and Me
(Continued)

representing all of the atoms of the metals of the group formed by silver, gold, platinum, copper and nickel present in the layer.

23 Claims, 8 Drawing Sheets

(51) Int. Cl.
*C03C 17/34* (2006.01)
*C23C 14/06* (2006.01)
*C23C 14/24* (2006.01)
*C23C 14/34* (2006.01)
*C23C 14/35* (2006.01)
*C23C 14/58* (2006.01)

(52) U.S. Cl.
CPC ............ *C03C 17/008* (2013.01); *C03C 17/34* (2013.01); *C23C 14/0688* (2013.01); *C23C 14/24* (2013.01); *C23C 14/3414* (2013.01); *C23C 14/352* (2013.01); *C23C 14/5806* (2013.01); *C03C 2217/212* (2013.01); *C03C 2217/256* (2013.01); *C03C 2217/29* (2013.01); *C03C 2217/45* (2013.01); *C03C 2217/465* (2013.01); *C03C 2217/47* (2013.01); *C03C 2217/485* (2013.01); *C03C 2217/91* (2013.01); *C03C 2218/156* (2013.01); *C03C 2218/32* (2013.01)

(56) References Cited

U.S. PATENT DOCUMENTS

| | | |
|---|---|---|
| 2012/0040175 A1 | 2/2012 | Hurst et al. |
| 2013/0115468 A1* | 5/2013 | Kharchenko ....... C03C 17/3626 427/160 |

FOREIGN PATENT DOCUMENTS

| | | |
|---|---|---|
| JP | 2006-256902 A | 9/2006 |
| JP | 2007-093589 A | 4/2007 |
| JP | 2008-233074 A | 10/2008 |
| WO | WO 2010/106370 A1 | 9/2010 |
| WO | WO 2017/098166 A1 | 6/2017 |

OTHER PUBLICATIONS

Silver, aqua-calc.com (Year: 2016).*
International Search Report dated Jun. 29, 2018 in PCT/FR2018/051075 filed Apr. 27, 2018.
Meng, F. et al., "Enhanced photo catalytic activity of silver nanoparticles modified $TiO_2$ thin films prepared by RF magnetron sputtering," Materials Chemistry and Physics, vol. 118, No. 2-3, Dec. 15, 2009, pp. 349-353, XP026703073.
Meng, F. et al., "A mechanism for enhanced hydrophilicity of silver nanoparticles modified $TiO_2$ thin films deposited by RF magnetron sputtering," Applied Surface Science, vol. 255, No. 13-14, Apr. 15, 2009, pp. 6715-6720, XP026066297.

* cited by examiner

COLOURED GLAZING AND METHOD FOR OBTAINING SAME

CROSS-REFERENCE TO RELATED APPLICATIONS

The present applications is the national stage of international application PCT/FR2018/051075, filed on Apr. 27, 2018, and claims the benefit of the filing datae of French Appl. No. 1753796, filed on Apr. 28, 2017.

BACKGROUND OF THE INVENTION

Field of the Invention

The present invention relates to a colored glazing, to the process for obtaining same and to an installation for performing the process. The invention finds its application in particular in the field of the surface treatment of a glass substrate so as to deposit thereon a coating which gives it a suitable coloring, without the need to add additional metal oxides to the initial glass composition. In general, said treatment is directed toward modifying the surface appearance of a glazing, especially of a colorless flat glass derived from an industrial process of the float glass type, to give it a coloring after it has been formed, by simple deposition of a coating in a thin layer, said coating being formed from a material which has an absorption peak in the visible range.

Description of Related Art

In the field of glazings for buildings, considerable studies have been devoted toward the development of novel glazings with varied properties: solar control glazings, self-cleaning glazings or the like. It is also increasingly sought to find glazings which combine several properties, and especially colored glazings which have one or more functionalities such as solar control, heat insulation (low-emissivity glazings), electromagnetic screening, heating, hydrophilic or hydrophobic functions, photocatalytic (self-cleaning glazings), modification of the level of reflection in the visible range (anti-reflection glazings or mirrors).

When it is desired to obtain colored glasses that may have a specific functionality, the current industrial process consists in adding pigments (generally metal oxides) to the melt bath of the float glass. At the time of manufacture of the glass, varied metal oxides may thus be used depending on the desired final color of the glazing: CuO for a red color, MnO for violet or CoO pour for blue. Glasses that are colored in their bulk are thus obtained.

Although this process is relatively simple to perform, it has a major drawback. The use of pigments at the time of producing the glass contaminates the melt bath and entails that are suitable color must be manufactured in a specific bath.

In particular, a change of color always requires the manufacture of a transition glass: a large amount of glass is thus lost until the desired color is obtained. This implies a substantial loss of production, and also of productivity of the installation, resulting in a substantial increase in the cost of the glazing if it is desired to modify its color. This process thus lacks flexibility to be able to adapt to clients' constantly changing demands.

One advantageous solution for increasing flexibility in the production of such colored glasses would consist in depositing thereon a coating consisting of or comprising a colored layer, the colorimetric characteristics of said coating needing to be, in this case, readily adjustable and modifiable.

According to a first known method for obtaining such a coating, use is made of a sol-gel process of polymerization of a metal alkoxide in the presence of silver metal particles or of another precious metal. However, this process is expensive and it is impossible thereby to deposit homogeneous layers of a few nanometers or a few tens of nanometers onto large-sized glass substrates such as PLFs, i.e. typically of "jumbo" size (6000 mm×3210 mm).

In a known manner, the coating of a substrate with one or more thin layers of a given material may also be performed in the vapor phase according to several different techniques:

According to a first method known as pyrolysis, the precursors of the products to be deposited, provided in gaseous, liquid or solid form, are decomposed on the hot substrate (T>500° C.). In the case of gaseous precursors, the method is referred to by the term AP-CVD (Atmospheric Pressure Chemical Vapor Deposition) or more generally thermal CVD. The present invention does not relate to such processes.

According to a second deposition method, cathode sputtering or magnetron sputtering processes are used, which consist in depositing the material or a precursor of the material to be deposited, by sputtering, under a secondary vacuum and in a magnetic field. An example of implementation of such a device is described, for example, in patent U.S. Pat. No. 6,214,183.

A third process, initially developed in the microelectronics sector and known as PE-CVD (Plasma Enhanced Chemical Vapor Deposition) has been described. According to this process, instead of using a target made of the material to be deposited, precursors thereof are injected in the form of a gas and decomposed in the electric discharge of the plasma. This process is generally performed at pressures of the order of 10 mTorr to 500 mbar (1 Torr=133 Pa, 1 bar=0.1 MPa). The substrate is generally used at room temperature or heated to relatively low temperatures (for example below 350° C.) to ensure the mechanical and adhesion properties of the deposited layer. This technique may be used, as a result of the moderate temperature imposed on the substrate, for the coating of heat-sensitive substrates formed, for example, from plastic polymers. A process of this nature is described, for example, in patent application EP 0 149 408.

Magnetron sputtering and, to a lesser extent, PE-CVD processes require implementation in an installation under vacuum and, as a result, taken individually, have very limited flexibility.

Deposition processes are known for making stacks of layers formed mainly from metal nanoparticles and dielectric layers, via techniques known as vacuum magnetron sputtering of a target. For example, the publication "Preparation and optical characterization of Au/SiO$_2$ composite films with multilayer structure, H. B. Liao, Weijia Wen, G. K. L. Wong, *Journal of Applied Physics*, 2003, Vol. No. 93, 4485" describes the manufacture of an SiO$_2$/Au stack absorbing at a wavelength of about 530 nm and having a red color in transmission.

Patent application WO 2010/106370 describes a method for depositing a coating onto a substrate, in which a solution of a precursor is deposited by CVD, AP-CVD or pyrolysis onto a substrate maintained at 330-370° C., to produce a matrix film of aluminum-doped tin, titanium or zinc oxide into which are incorporated gold nanoparticles. Such a process does not appear to be flexible enough or suitable for industrial-scale application, especially for the coloring of glass of large dimensions on flat glass substrates derived from a float process, the width of which is often of the order of several meters as explained previously.

BRIEF SUMMARY OF THE INVENTION

An aspect of the invention provides a glazing comprising a glass substrate on which is deposited a coating comprising at least one layer, said layer being formed from a material comprising metal nanoparticles dispersed in an inorganic matrix of an oxide, in which said metal nanoparticles are made of a metal chosen from the group formed by silver, gold, platinum, copper and nickel or of an alloy formed from at least two of these metals; said matrix comprises, is formed essentially from or is formed from an oxide of at least one element chosen from the group of titanium, silicon and zirconium, wherein the atomic ratio M/Me in said material is less than 1.5, M representing all of the atoms of the elements of the group of titanium, silicon and zirconium present in said layer and Me representing all of the atoms of the metals of the group formed by silver. gold, platinum, copper and nickel present in said layer.

DETAILED DESCRIPTION OF THE INVENTION

Figure 1:
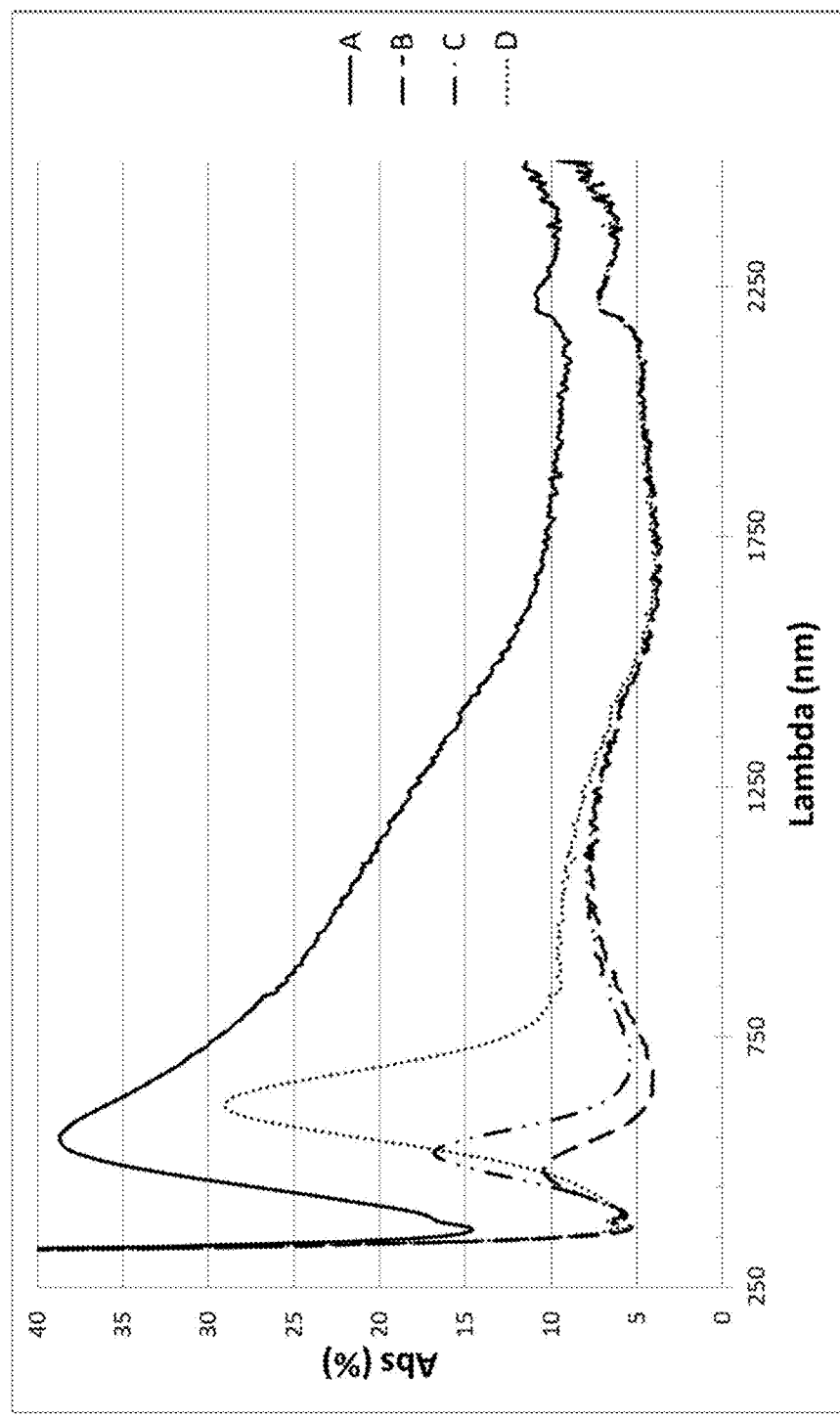
FIG. 1 shows the absorption spectra in the visible range for the glazings obtained according to the examples with wavelength given in nanometers on the x-axis.

The subject of the present invention is thus, according to a first aspect, that of proposing a glazing and processes for obtaining same which allow such a solution to be performed, i.e. the deposition of such a coating, the colorimetry of which is readily adjustable. According to a main aspect, the subject of the present invention is thus a glazing comprising on its surface layer which modifies its color, the characteristics of this layer being readily adaptable, so as finally to give said glazing the desired colorimetry.

More particularly, one of the objects of the present invention is to overcome the problems presented previously by proposing a modulable manufacturing process which allows rapid and flexible adaptation of the colorimetry desired for the glazing, said process moreover being economical and not causing any substantial loss of float glass production.

According to the present invention, a glazing is described which is obtained via a process comprising the deposition onto a glass substrate which is in principle initially uncolored (often referred to in the art as clear glass) of a coating which gives it an adaptable color. Without departing from the context of the invention, the substrate might, however, already be colored, the deposition of the coating according to the invention then serving to modify its colorimetry.

Implementation of the present invention affords several advantages. Firstly, the coloring is performed entirely independently of the manufacture of the glass, in particular for a colorless glass. Thus, glass may be manufactured without the need to envisage its coloring beforehand. The thin layers also make it possible to obtain colored glasses in small amount; the present process is thus much more adaptable to the demand and flexible. By means of the present invention, it becomes possible to produce layers of different colors and in different proportions, and to do so without intermediate loss of large amounts of glass.

According to a first aspect, the invention relates more particularly to a glazing which may be obtained via one of the processes described below and comprising a glass substrate on which is present a layer, said layer being a sole layer or alternatively present in a stack of layers, said layer being formed from a material comprising metal nanoparticles dispersed in an inorganic matrix of an oxide, said metal nanoparticles being made from at least one metal chosen from the group formed by silver, gold, platinum, copper and nickel or said metal particles being made of an alloy formed from at least two of these metals, said matrix comprising an oxide of at least one element chosen from the group formed by titanium, silicon and zirconium or a mixture of at least two of these elements, said material having a plasmon absorption peak in the visible range. Preferentially, said matrix is formed essentially by said oxide or is formed by said oxide.

According to the invention, the atomic ratio M/Me in said layer is less than 1.5, in which M represents all of the atoms of said elements of the group of titanium, silicon and zirconium present in said layer and Me represents all of said atoms of the metals of the group formed by silver, gold, platinum, copper and nickel present in said layer.

Preferably, said atomic ratio is less than 1.4, or even less than 1.3. More preferably, said ratio is less than 1.2, or even is less than 1.0, or even is less than 0.9 or, even more, less than 0.8 or, very preferably, is less than 0.7.

In particular, in such a preferred glazing according to the invention:
- the metal atoms Me represent between 20% and 50% of the atoms present in the material constituting the layer, preferably between 25% and 45% of the atoms present in the material constituting the layer and very preferably between 30% and 40% of the atoms present in the material constituting the layer.
- The metal atoms Me represent between 20% and 50% of all of the atoms M, Me and O present in the material constituting the layer.
- The atoms of the element(s) M together represent between 10% and 40% of the atoms present in the material constituting the layer, preferably between 15% and 30% of the atoms present in the material constituting the layer and very preferably between 20% and 30% of the atoms present in the material constituting the layer.
- The atoms of the element(s) M together represent between 10% and 40% of all of the atoms M, Me and O present in the material constituting the layer.

The thickness of the layer is between 5 and 100 nm, or even between 4 and 70 nm, especially between 5 and 50 nm and very preferably between 6 and 20 nm.

The inorganic matrix is formed or formed essentially from titanium oxide TiOx, with 1×2.

The metal Me is unique and/or is silver Ag.

The metal nanoparticles have a globular form, especially substantially round or else oblong, the longest dimension of said particles, as measured by transmission electron microscopy (TEM), having an (arithmetic) mean of between 2 and 20 nm, preferably between 4 and 15 nm, more preferably between 4 and 10 nm.

The metal nanoparticles are distributed in the layer in an increasing concentration gradient, from each surface of the layer to the center of said layer, the concentration of silver particles being at a maximum substantially at the center of the layer.

The glazing also comprises at least one overlayer deposited onto said layer relative to the glass substrate, said overlayer being made of a dielectric material. For the purposes of the present description, the term "dielectric material" especially means any material whose resistivity is initially greater than $10^{10}$ ohm-meters (Ω·m). Such materials may, however, be doped to improve their electrical conductivity so as to increase their cathode sputtering yield. For example, $Si_3N_4$ layers used in the stack according to the invention may comprise aluminum.

According to this preferred embodiment of the invention, the deposition onto the colored layer according to the invention of a protective layer made of a dielectric material makes it possible to increase the mechanical and/or chemical durability of said coating. The thickness of this protective layer may be, for example, from about 5 to 50 nm.

Said dielectric material constituting said overlayer is formed essentially from a silicon and/or aluminum nitride, in particular is formed essentially from a silicon nitride, more preferably with a thickness of between 5 and 50 nm, or even between 10 and 30 nm.

Said dielectric material constituting said overlayer is formed essentially from an oxide of at least one element chosen from silicon, titanium, zinc and tin.

The glazing also comprises at least one underlayer deposited under said layer relative to the glass substrate, said underlayer being made of a dielectric material.

Said dielectric material constituting said underlayer is formed essentially from a silicon and/or aluminum nitride, in particular is formed essentially from a silicon nitride.

Said dielectric material constituting said underlayer is formed essentially from an oxide of at least one element chosen from silicon, titanium, zinc and tin.

In addition, the present invention relates to processes for simply and economically obtaining coatings of colored layers which absorb the incident visible radiation at a readily adjustable wavelength, formed from metal nanoparticles surrounded with an oxide dielectric matrix.

According to a first embodiment, the present invention thus relates to a process for depositing a layer onto a glass substrate making it possible in particular to obtain the glazing described previously, said process comprising a step in which two targets preferably comprising the same oxide, but whose composition varies via the addition of a metal to the second target, are simultaneously co-sputtered with a plasma, in the same chamber of a vacuum deposition device. According to the invention, the thin layer thus obtained comprises nanoparticles of said metal or of said alloy dispersed in an inorganic matrix of the constituent oxide of the two targets, the material thus made especially having a plasmon absorption peak in the visible range which gives the glazing thus obtained a color, said color also being able to be obtained by means of an additional heat treatment step, if necessary.

More particularly, according to a first embodiment, the present invention relates to a process for depositing a layer of a material having a plasmon absorption peak whose maximum is between 350 and 800 nm onto a glass substrate, in particular for the manufacture of a glazing as described previously, said process being characterized in that it comprises at least the following steps:

a) said substrate is passed into a cathode sputtering vacuum deposition device, b) a plasma-generating gas is introduced into said vacuum deposition device and a plasma is generated from said gas, c) the following are simultaneously sputtered, in the same chamber of the vacuum deposition device:
  a first target comprising, preferably formed essentially by, an oxide of at least one element chosen from the group of titanium, silicon and zirconium,
  a second target made of an oxide of at least one element chosen from the group of titanium, silicon and zirconium and of particles of a metal included in the group formed by silver, gold, platinum, copper and nickel or particles of an alloy formed from at least two of these metals, said target having an M/Me atomic ratio of less than 1.5, M representing all of the atoms of the elements of said group of titanium, silicon and zirconium and Me representing all of the atoms of the metals of the group formed by silver, gold, platinum, copper and nickel, said sputtering being obtained by means of said plasma,
  said sputtering being obtained by means of said plasma, d) a glazing comprising said substrate covered with said layer is recovered, said layer being formed from metal nanoparticles of said metal or of said alloy dispersed in an inorganic matrix of the oxide and having a plasmon absorption peak in the visible range, or d') a glazing comprising said substrate covered with said layer is recovered and said layer is heat-treated, in particular via a treatment as described in patent application WO 08/096089, under conditions suitable for obtaining a layer formed from metal nanoparticles of said metal or of said alloy dispersed in an inorganic matrix of the oxide and which has a plasmon absorption peak in the visible range.

According to particular and preferred embodiments of such a method, which may of course be combined together:
  the elements chosen for the oxide of the first target and for the oxide of the second target are identical;
  the oxide of the first target and of the second target is formed essentially from or is formed from a titanium oxide.

According to a second embodiment, the present invention also relates to a process for depositing a layer of a material having a plasmon absorption peak whose maximum is between 350 and 800 nm onto a glass substrate, in particular for the manufacture of a glazing as described previously, said process being characterized in that it comprises at least the following steps:

a) said substrate is passed into a cathode sputtering vacuum deposition device, b) a plasma-generating gas is introduced into said vacuum deposition device and a plasma is generated from said gas, in the presence of oxygen, c) a target is sputtered in a chamber of said device, said target comprising an oxide of at least one element chosen from the group of titanium, silicon and zirconium, preferably formed essentially from such an oxide, and of particles of a metal included in the group formed by silver, gold, platinum, copper and nickel or particles of an alloy formed from at least two of these metals, said target having an M/Me atomic ratio of less than 1.5, M representing all of the atoms of the elements of said group of titanium, silicon and zirconium and Me representing all of the atoms of the metals of the group formed by silver, gold, platinum, copper and nickel, said sputtering being obtained by means of said plasma, d) a glazing comprising said substrate covered with said layer is recovered, said layer being formed from metal nanoparticles of said metal or of said alloy dispersed in an inorganic matrix of the oxide and having a plasmon absorption peak in the visible range, or d') a glazing comprising said substrate covered with said layer is recovered and said layer is heat-treated, under conditions suitable for obtaining a layer formed from metal nanoparticles of said metal or of said alloy dispersed in an inorganic matrix of the oxide and which has a plasmon absorption peak in the visible range.

According to particular and preferred embodiments of such a second method, which may of course be combined together: the oxide of the target is formed essentially from titanium oxide, the metal is silver, gold or platinum, more preferably silver.

Preferably, for these two embodiments:

the plasma-generating gas is a neutral gas essentially comprising argon, krypton on or helium, alone or as a mixture.

Said process comprises, during step d'), heating of the substrate up to a temperature above 400° C. and below the softening point of the glass substrate.

According to the invention, the heating step according to step d') is performed under temperature conditions and for the time required to obtain the plasmon absorption peak, i.e. to obtain the desired color of the layer, according to techniques that are well known to those skilled in the art. Needless to say, such heating may be performed under any atmosphere that is suitable for this purpose, in particular an oxidative atmosphere such as air or alternatively under an atmosphere of a neutral gas or even under a reductive atmosphere.

Said color is readily adjustable according to the first embodiment especially by modifying the conditions of said sputtering and in particular by adjusting the power applied to the two targets.

According to particular and preferred embodiments of a process according to one or other of the preceding methods, which may of course be combined together:

the atomic ratio M/Me in the target is less than 1.5, preferably less than 1.2, more preferably less than 1.0, or even is less than 0.9, or even less than 0.8 or very preferably less than 0.7, M representing all of the atoms of the elements of said group of titanium, silicon and zirconium present in said layer and Me representing all of the atoms of the metals of the group formed by silver, gold, platinum, copper and nickel present in said layer.

The thickness of the layer deposited is between 5 and 100 nm, preferably between 6 and 50 nm and very preferably between 7 and 20 nm.

Also, the invention relates to an installation for performing the process according to the first embodiment described previously, said installation comprising in combination:

a cathode sputtering device comprising at least one vacuum chamber, a first target as described previously, made of an oxide of at least one element chosen from the group of titanium, silicon and zirconium, a second target as described previously, made of an oxide of at least one element chosen from the group of titanium, silicon and zirconium and particles of a metal included in the group formed by silver, gold, platinum, copper and nickel or particles of an alloy formed from at least two of these metals, means for the simultaneous co-sputtering of the two targets, comprising means for introducing a plasma-generating gas and means for generating a plasma from said gas, said plasma serving for the sputtering of said targets, means for passing the substrate through said device, at a speed that is suitable for the deposition, onto a surface thereof, of a layer formed from metal nanoparticles dispersed in an inorganic matrix of said oxide, means for recovering at the outlet of the device said substrate covered with said coating.

In addition, the invention relates to the use of an installation as described previously for the manufacture of colored glass substrates comprising a layer as described previously.

According to the invention and this first embodiment, to create the plasma, the cathode, which may comprise two rotating targets or two planar targets, may be powered by an RF (radio-frequency) power source or a DC (direct current) power source, which may be pulsed, or alternatively by an AC (alternating current) power source. As is known, an RF power source normally provides an alternating current of 13.56 MHz. The use of this power source requires a connection box to connect the generated signal to the target.

In practice, when it is sought to sputter a sparingly conductive or non-conductive target, an RF power source will preferentially be used.

According to the deposition process according to the invention, it is also possible, or even preferred, to use a DC power source, which makes it possible to obtain a higher level of sputtering.

The invention, the various aspects thereof and the advantages thereof will be understood more clearly on reading the nonlimiting examples that follow, which are provided for purely illustrative purposes.

In a first series of examples, it is sought to deposit, according to the second process of the invention described previously, a colored layer formed from an oxide matrix of the element Ti in which are dispersed silver metal particles on a colorless glass substrate. The clear glass used is marketed under the reference Planiclear® by the Applicant Company.

The colored layers according to the invention are deposited on a glass substrate in a magnetron-type cathode sputtering housing delimiting a chamber in which a secondary vacuum may be applied. In this housing (constituting the anode), the targets (constituting the cathodes) are installed in the chamber so that, during the deposition, an RF or DC power source makes it possible to ignite a plasma of a plasma-generating gas, of argon, in front of said targets, the substrate passing parallel to this target. It is possible according to this installation to choose the speed of passage of the substrate and thus the deposition time and the thickness of the layer.

The target is manufactured from a mixture of titanium oxide and of silver particles in accordance with the techniques described hereinbelow, so that its Ti/Ag atomic ratio in the target is about 0.5.

The power required to generate a plasma of the gas in the device is applied to the cathode. The deposition takes place under an atmosphere essentially of argon (neutral plasma-generating gas) and in the presence of a small portion of dioxygen in the housing chamber. More precisely, for all the examples that follow, the flow rate of argon injected into the chamber is initially about 30 sccm (standard cubic centimeters per minute). The deposition time is 60 or 100 seconds, depending on the example. The thickness of the layers thus obtained is from about 6 to 9 nm.

Various layers are thus deposited via these same principles onto several clear glass substrates, the oxygen concentration in the gas mixture being varied so as to obtain various samples. These samples are noted A to D and comprise a layer formed from a titanium oxide comprising silver nanoparticles. Table 1 below summarizes the main parameters of the step of depositing the coating layer according to the present process.

TABLE 1

| | | | TiOx/Ag layer | | | |
|---|---|---|---|---|---|---|
| Sample | Substrate | Pressure μbar | Power on the cathode (W) | Deposition time (s) | Ar (sccm) | Ar/O$_2$ (sccm) |
| A | glass | 5 | 150 | 100 | 30 | 0 |
| B | glass | 5 | 150 | 60 | 28 | 2 |
| C | glass | 5 | 150 | 60 | 28 | 4 |
| D | glass | 5 | 150 | 100 | 28 | 4 |

After this first deposition, a 30 nm silicon nitride overlayer is deposited onto said TiOx-Ag layer in another compartment of the installation, according to the standard techniques known in the field. The deposition onto the colored layer according to the invention of a protective layer made of a dielectric material makes it possible to increase the mechanical and/or chemical and/or thermal durability of said coating.

The term "mechanical durability" means the scratch or abrasion resistance, and the term "chemical durability" especially means the corrosion resistance within the meaning of standard EN1096 cited below. The term "thermal durability" means the stability with respect to one or more thermal cycles, for example toughening, bending or annealing.

After the deposition, the substrates equipped with the various coatings are annealed at 650° C. in air for 8 minutes and at atmospheric pressure (1 bar). For each example, the properties of the coatings thus deposited are then measured according to the following protocols:

Optical spectra of the samples were produced using a Lambda 900 spectrophotometer over the wavelength range from 250 nm to 2500 nm. Glass-side and layer-side transmission and reflection measurements are taken. The absorption spectrum and any presence of a plasmon absorption peak in the visible range are determined from the measurements by the following relationship: A=100−T−R (glass side), in which A is the absorption, T is the transmission and R the reflection.

The coefficients of light transmission and reflection are measured according to standard ISO 9050 (2003).

The attached FIG. 1 reports the absorption spectra in the visible range for the glazings obtained according to the preceding examples (wavelength given in nanometers on the x-axis).

From the spectrum obtained, the values L*, a* and b* (international system) which characterize the color yield are determined, in transmission and using the illuminant D65 (2°).

For each of the examples, the results obtained are collated in Table 2 below.

TABLE 2

| Example | LT | LR (layer side) | LR (glass side) | Colorimetry | Plasmon peak position | Perceived color |
|---|---|---|---|---|---|---|
| A | 50.8 | 11.9 | 19.1 | L* = 76.6<br>a* = 2.0<br>b* = −11.6 | 550 nm | violet |
| B | 75.3 | 17.8 | 18.4 | L* = 89.5<br>a* = 2.1<br>b* = 2.0 | 480 nm | golden yellow |
| C | 70.5 | 16.9 | 18.0 | L* = 87.2<br>a* = 5.2<br>b* = −2.2 | 520 nm | pink |
| D | 66.0 | 12.2 | 14.4 | L* = 85<br>a* = −5.7<br>b* = −7.4 | 610 nm | blue |

The results reported in the preceding Table 2 show the advantages associated with the present invention. In particular, in a surprising and hitherto undescribed manner, according to a process in accordance with the invention, by simple adjustment of the operating conditions under which the deposition of the layer is performed, in particular the oxygen concentration in the target-sputtering plasma and/or the deposition time in the chamber, it is possible according to the invention to shift the plasmon peak to a chosen wavelength and finally to obtain the desired color for the glazing.

The chemical composition of the colored layer of the preceding examples was analyzed.

According to a first series of analyses, the compositions of the layers according to Examples A (violet color) and D (blue color) were determined with a Castaing microprobe (electron probe microanalyser or EPMA).

The results obtained for the two samples are collated in Table 3 below:

TABLE 3

| | Layer Ex. A at. % | Layer Ex. D at. % |
|---|---|---|
| Ag | 34 | 38 |
| O | 44 | 41 |
| Ti | 22 | 21 |
| Ti/Ag | 0.65 | 0.55 |

Transmission electron microscopy (TEM) analyses are also performed to visualize the morphology and the distribution of the silver nanoparticles within the titanium oxide matrix in the colored layers according to the invention. The images obtained in bright field mode for the samples of Examples A (violet-colored layer) and D (blue-colored layer) described previously are reported in FIGS. 2 to 5.

More precisely, in a preparation step, a carbon deposit about 50 nm thick was produced on the surface of the four samples. Next, a tungsten deposit was produced by IBID on the sampling zone during the preparation by FIB of the thin slice. The TEM (transmission electron microscopy) observations were made using an FEI Tecnai Osiris microscope (200 keV-SERMA Technologies, Grenoble) equipped with a ChemiSTEM™ X-EDS detector. In order to "disperse" the metal particles on the images obtained in "bright field" mode and thus to be able to evaluate the dimensions thereof more precisely, the TEM acquisitions were made in a first stage with the glazing edgeways on (FIGS. 2 and 4) and then by inclining the glazing at an angle of 15° relative to the plane of the glass surface (see FIGS. 3 and 5).

Figure 2:
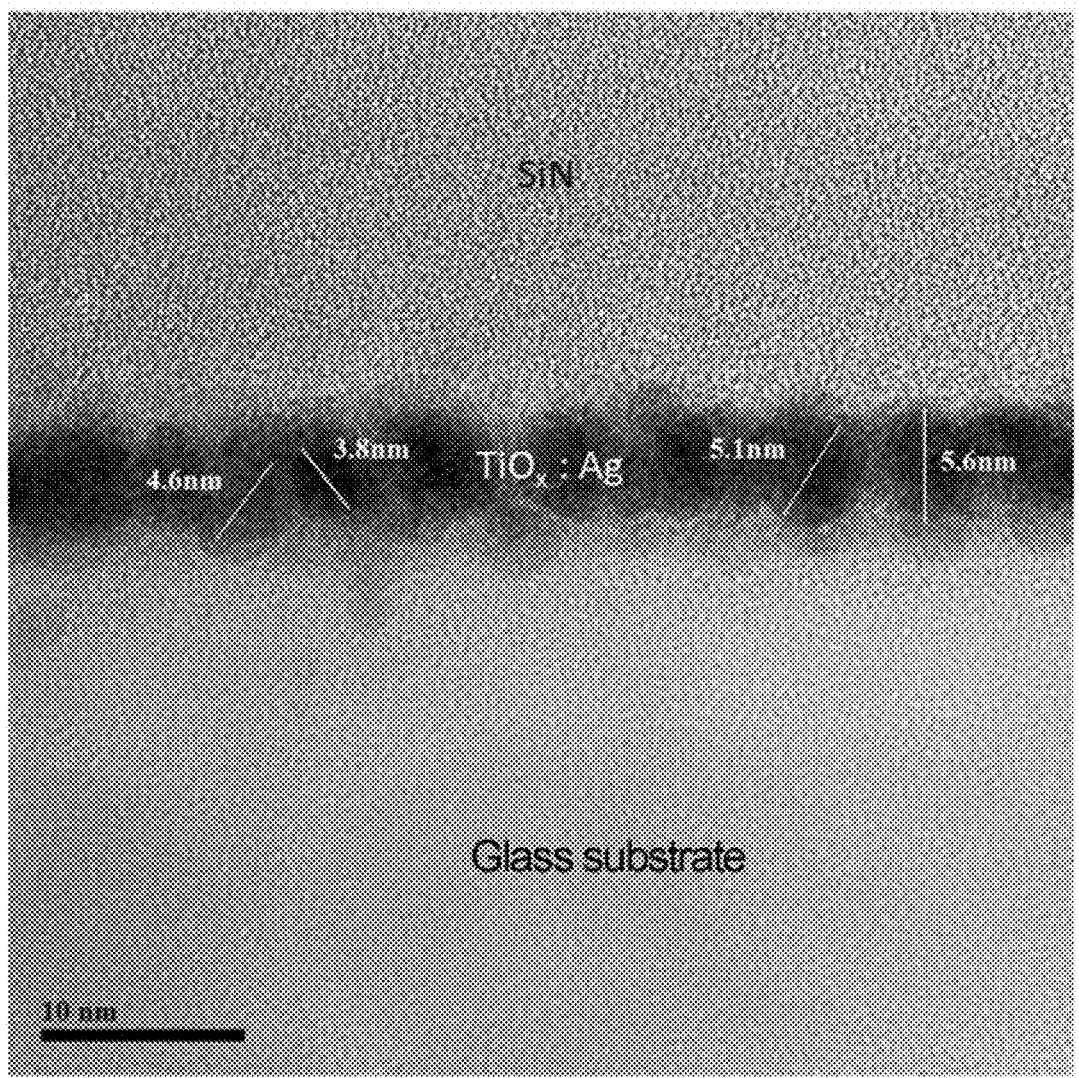
FIG. 2 shows a transmission electron microscopy (TEM) for visualizing the morphology and the distribution of the silver nanoparticles within the titanium oxide matrix in the colored layers according to the invention, obtained in bright field mode for the samples of Examples A and D.

More precisely:

FIG. 2 corresponds to a bright-field TEM image of sample A (violet shade) obtained without inclining.

Figure 3:
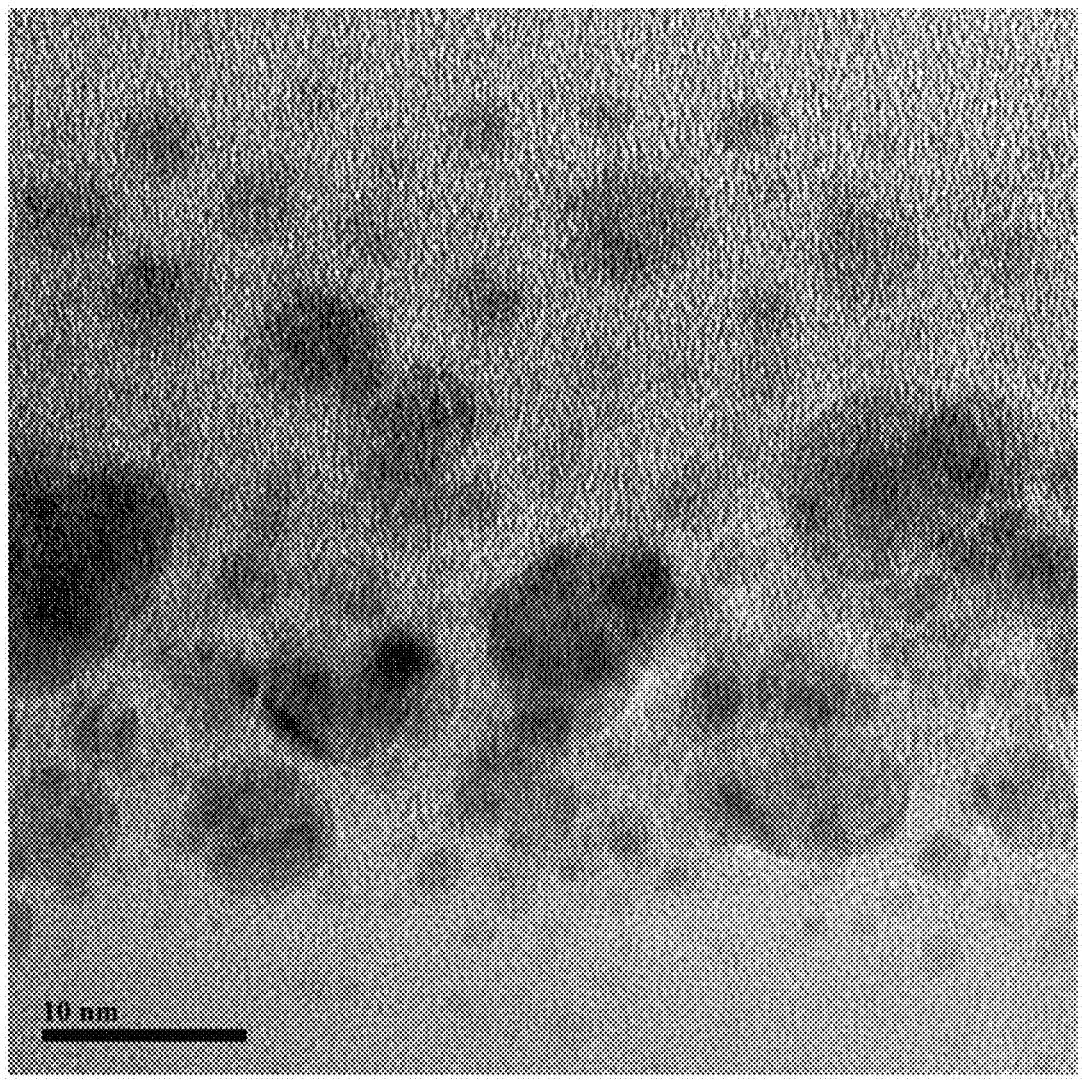
FIG. 3 shows a TEM showing the morphology and the distribution of the silver nanoparticles within the titanium oxide matrix in the colored layers according to the invention, obtained in bright field mode for the samples of Examples A and D.

FIG. 3 corresponds to a bright-field TEM image of sample A obtained by inclining the observation axis by 15° relative to the plane of the glass surface.

Figure 4:
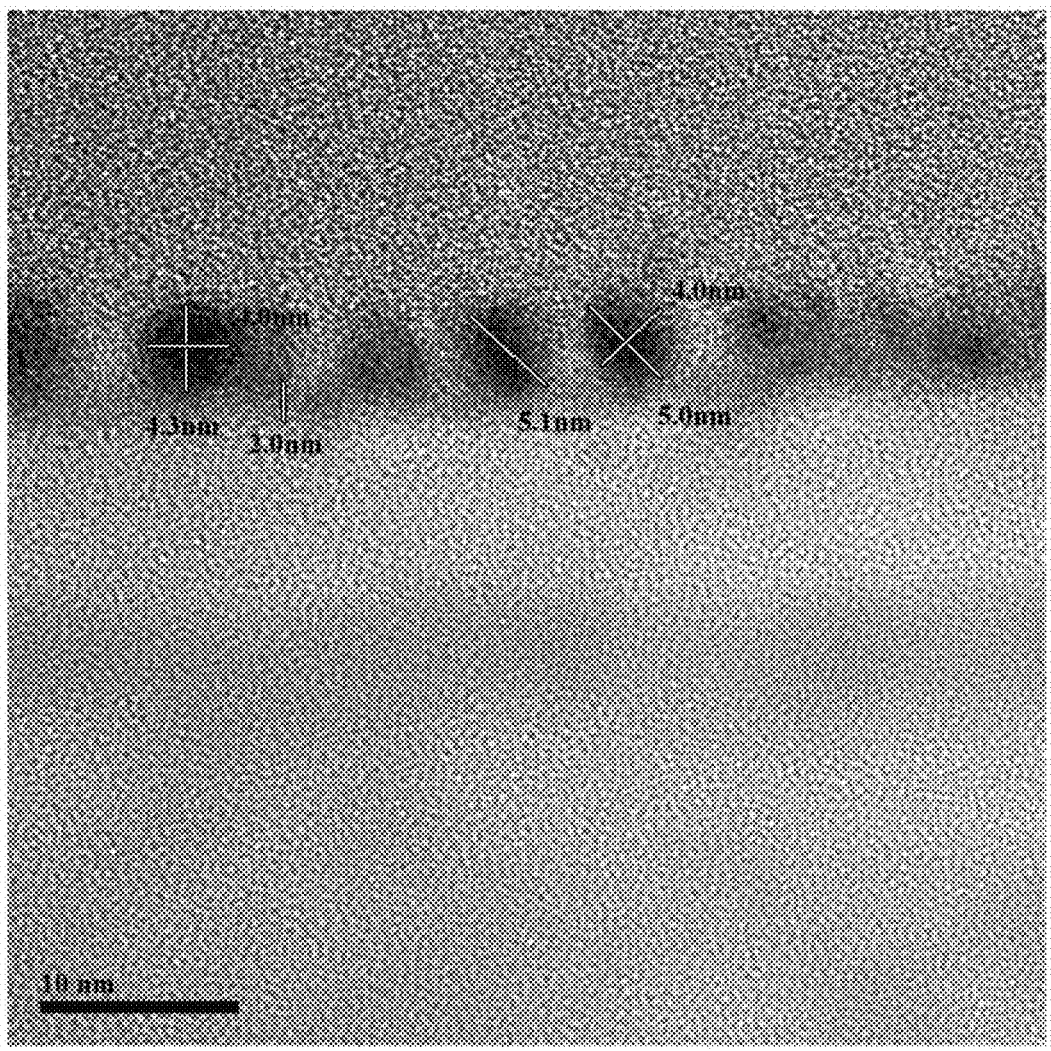
FIG. 4 shows a TEM showing the morphology and the distribution of the silver nanoparticles within the titanium oxide matrix in the colored layers according to the invention, obtained in bright field mode for the samples of Examples A and D.

FIG. 4 corresponds to a bright-field TEM image of sample D (blue shade) obtained without inclining.

Figure 5:
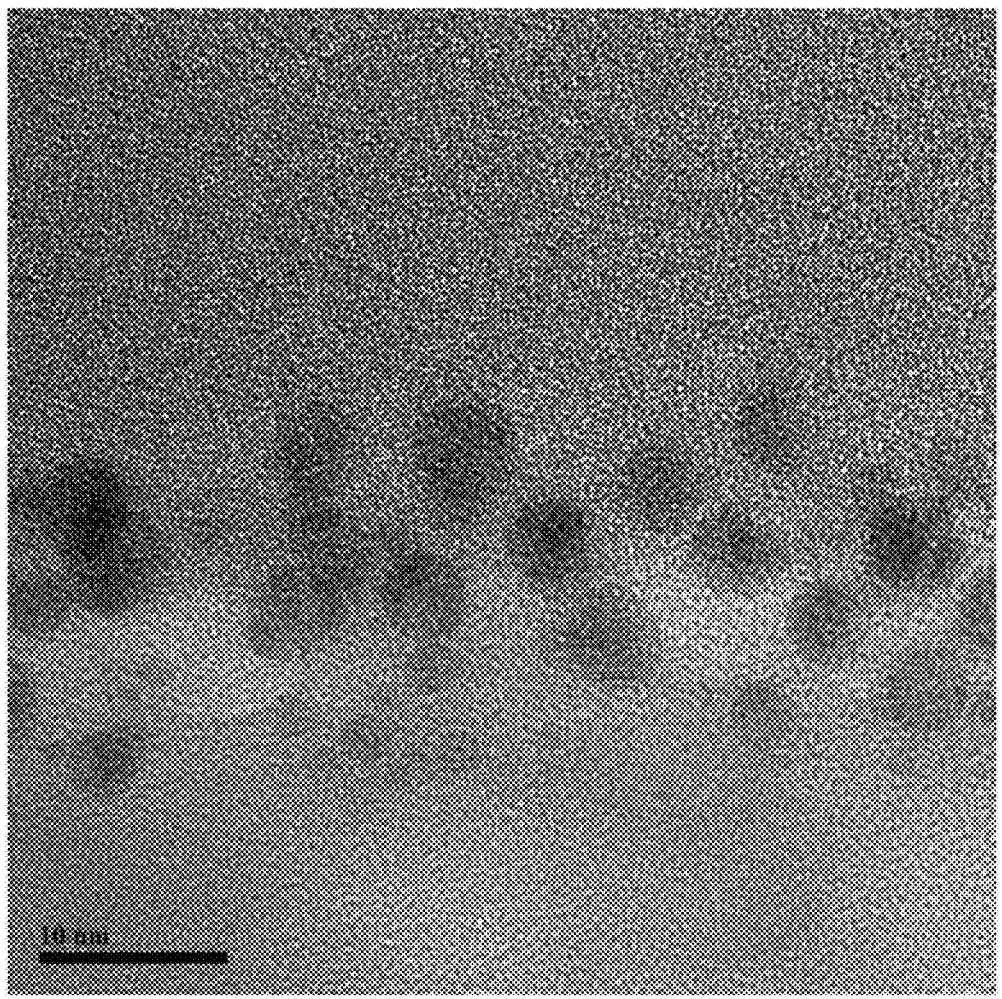
FIG. 5 shows a TEM showing the morphology and the distribution of the silver nanoparticles within the titanium oxide matrix in the colored layers according to the invention, obtained in bright field mode for the samples of Examples A and D.

FIG. 5 corresponds to a bright-field TEM image of sample D by inclining the observation axis by 15° relative to the plane of the glass surface.

Figure 6:
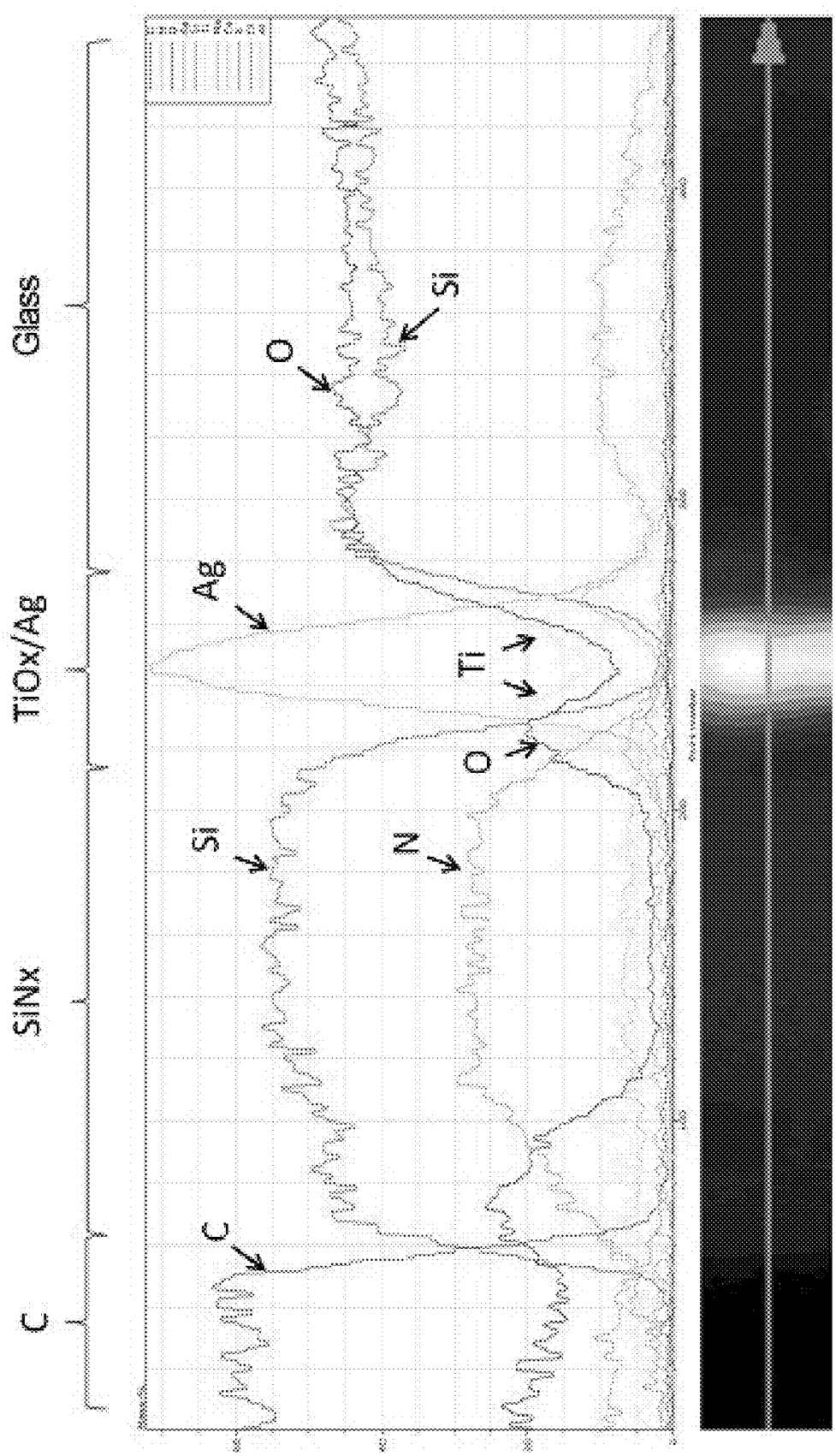

FIG. 6 reports the results of the energy-dispersive x-ray (X-EDS) analysis of the sample according to Example A.

Figure 7:
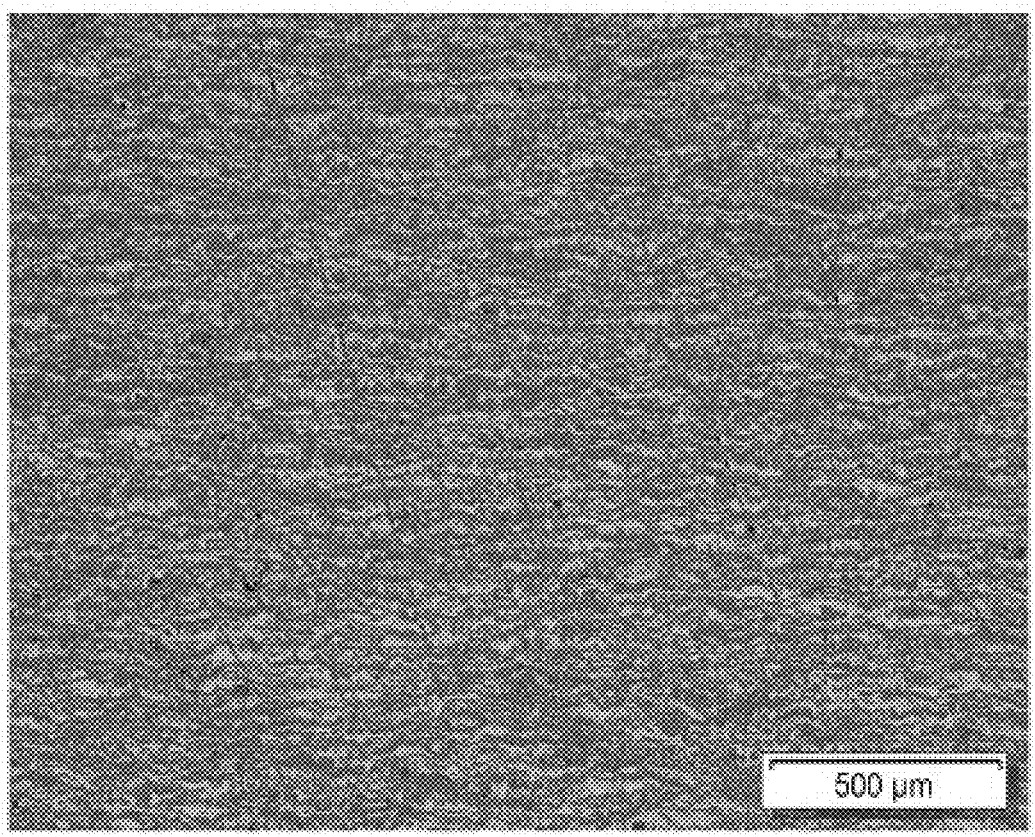
Figure 8:
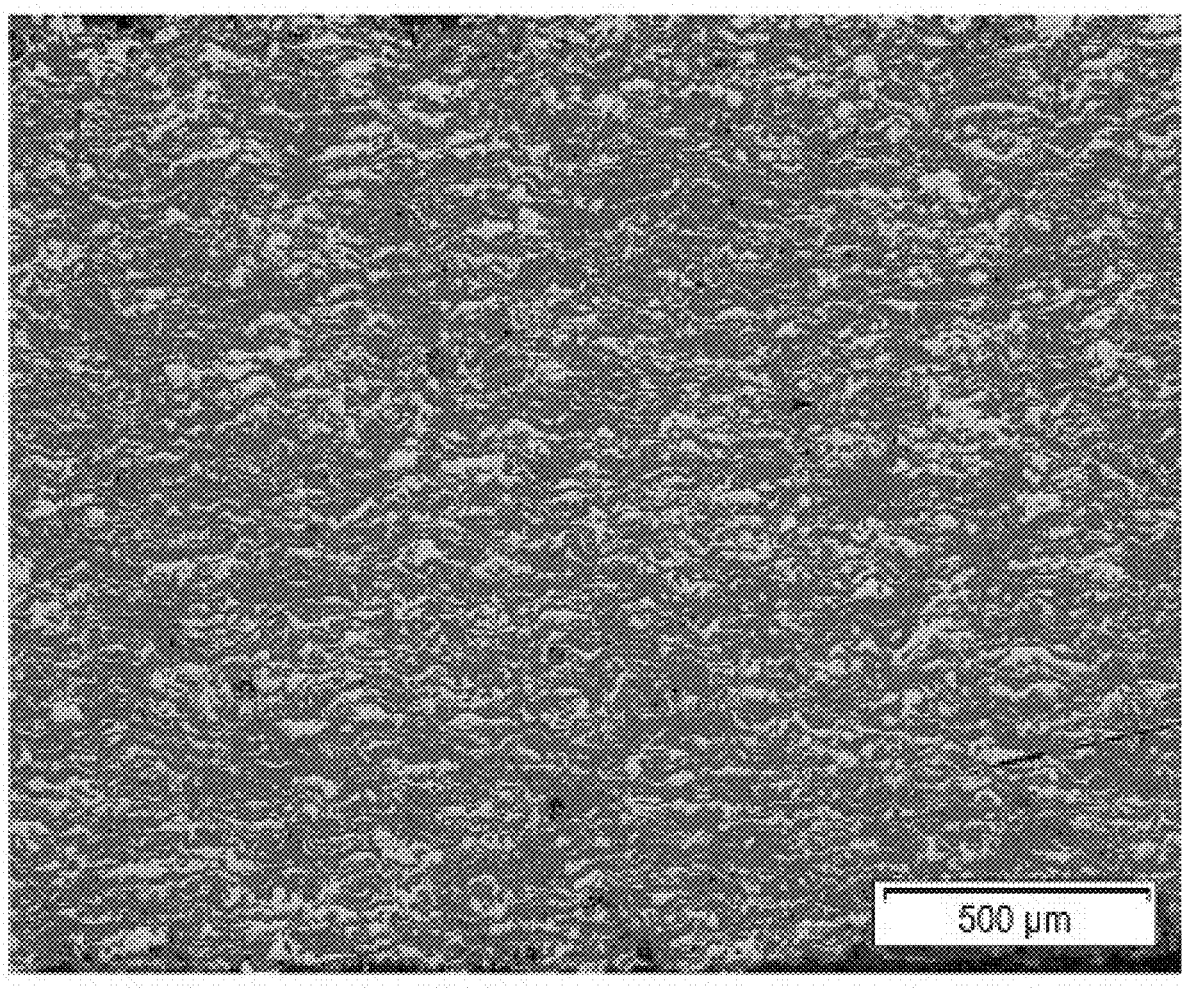

FIGS. 7 and 8 are images, respectively, of a flat target and of a tubular target from which the glazing may be obtained.

It is observed that silver nanoparticles of substantially globular form are concentrated in the layer (of the matrix). The dimensions of said nanoparticles can be measured, as indicated in FIGS. 2 and 3. These nanoparticles have, along their longest dimension and on average, a size from about 3 to 12 nm, depending on the sample.

Table 4 below indicates the main characteristics of the silver nanoparticles included in the TiOx layer, measured for samples A to D according to the TEM technique.

TABLE 4

| Layer | A | B | C | D |
|---|---|---|---|---|
| Particle size distribution* (nm) | 2 to 10 | 3 to 5 | 5 to 12 | 3 to 6 |
| Mean particle size* (nm) | 5 | 5 | 8 | 5 |
| Particle morphology | round | round | ovoid | round |

*length along their longest dimension

In order more precisely to characterize the distribution of the nanoparticles in the colored layer according to the invention, an energy-dispersive x-ray (X-EDS) analysis of the sample according to Example A (violet shade) is also performed. The distribution of the elements, as reported in the attached FIG. 6, shows in the TiOx/Ag colored layer a greater concentration of the silver nanoparticles at the center of said layer. This same characteristic distribution was observed on all the layers A to D obtained according via process according to the invention.

In a second series of examples, it is sought to deposit, according to the first process according to the invention described previously, a colored layer formed from an oxide matrix of the element Ti in which are dispersed silver metal particles on a colorless glass substrate. The clear glass used is marketed under the reference Planiclear® by the Applicant Company.

The colored layers according to the invention are deposited on a glass substrate in a magnetron-type cathode sputtering housing delimiting a chamber in which a secondary vacuum may be applied. In this housing (constituting the anode), the targets (constituting the cathodes) are installed in the chamber so that, during the deposition, an RF or DC power source makes it possible to ignite a plasma of a plasma-generating gas, usually essentially argon, krypton or helium, in front of said targets, the substrate passing parallel to this target. It is possible according to this installation to choose the speed of passage of the substrate and thus the deposition time and the thickness of the layer.

A commercial titanium oxide (TiOx) target is used to make the first target according to the invention.

The second target is manufactured from a mixture of titanium oxide and of silver particles in accordance with the techniques described hereinbelow.

The second target is manufactured such that the Ti/Ag atomic ratio in the target is about 0.5, according to the techniques described below.

The power required to generate a plasma of the gas in the device is applied to the two cathodes. The deposition takes place under an atmosphere exclusively of argon as plasma-generating neutral gas in the housing chamber. More precisely, for all the examples that follow, the flow rate of argon injected into the chamber is 30 sccm (standard cubic centimeters per minute). The deposition time is 200 seconds for all the samples. The thickness of the layers thus obtained is from about 10 to 15 nm.

Several layers are deposited according to these same principles, varying the power applied to the two cathodes so as to obtain various dielectric matrices formed from a titanium oxide comprising silver nanoparticles present in different concentrations. Table 1 below summarizes the main parameters of the step of depositing the coating layer according to the present process.

TABLE 5

| Example | Argon (sccm) | Power applied to target 1 made of TiOx (W) | Power applied to target 2 made of TiOx—Ag (W) | Dry deposit time |
|---|---|---|---|---|
| E | 30 | 100 | 100 | 200 |
| F | 30 | 200 | 100 | 200 |
| G | 30 | 300 | 100 | 200 |
| H | 30 | 200 | 0 | 200 |

Optical spectra of the samples were acquired using a spectrophotometer under the same conditions as described previously. Glass-side and layer-side transmission and reflection measurements are taken to allow an absorption spectrum to be replotted. The central positions of the absorption peaks are reported in Table 6 below.

TABLE 6

| Example | Absorption peak position |
|---|---|
| E | 490 nm |
| F | 440 nm |
| G | 420 nm |
| H | — |

The chemical composition of the colored layers according to Examples E to G were analyzed according to the same methods as described previously. The Ti/Ag mole ratio in the layers ranges between 0.7 to 1.0.

In order more precisely to characterize the nanoparticle distribution in the colored layer according to the invention, an energy-dispersive x-ray (X-EDS) analysis of samples E to G is also performed. As for Examples A to C, the distribution of the elements shows in the TiOx/Ag colored layer a higher concentration of silver nanoparticles at the center of said layer for samples E to G.

According to such a process comprising a step of co-sputtering of two targets on which the applied power may be varied, it thus becomes possible to vary without difficulty the optical properties of the layer. In particular, by increasing the power on the first TiOx target, it is possible immediately to modify the colorimetry of the layer deposited and thereby of the glazing. In particular, it becomes possible to adjust the concentration of Ag nanoparticles in the layer as a function of the desired color of the layer and of the glazing.

According to a process according to the invention, it thus ultimately becomes possible to fully control and to vary within a wide range the color of the glazing very easily and economically, without loss of production.

In particular, by simple deposition of a coating layer, it is possible via such a process according to the invention, by simple adjustment of the power applied to the two cathodes in the device according to the invention, to modify rapidly and without difficulty and over a broad range the color of the final glazing (substrate covered with the layer).

Certain particular characteristics of implementation of the target according to the invention are described below. Said target is formed from a combination of oxide of metal M (M representing all of the atoms of the elements of said group of titanium, silicon and zirconium) and of metal Me (Me representing all of the atoms of the metals of the group formed by silver, gold, platinum, copper and nickel) as described previously. The target according to the invention also preferably meets the following criteria:
- a homogeneous distribution of the elements M, on the one hand, and Me, on the other hand, so that no heterogeneity of dispersion of nanoparticles of Me in the matrix of oxide of M in the thin layer derived from the target is observed. This homogeneity is required both in the length and width dimensions and in the thickness of the target. The methodology and the criteria for characterizing the homogeneity of distribution are defined below.
- an electrical resistivity that is compatible with use in AC, RF and also DC magnetron sputtering. For this, as a guide, the resistivity of the target must be <5 Ω·cm. Values higher than this threshold may be considered, but compatibility with the DC mode will in this case not be guaranteed.
- a degree of porosity of less than 10%, preferentially less than 5%, so as to reduce any risk of formation of an electric arc (arcing) which may lead to local melting of the metal Me of the target.

To achieve an optimum electrical resistivity that is as low as possible, it is advantageous to make use of a formulation that is slightly sub-stoichiometric in oxygen of the oxide of the metal M when this form has an electrical resistivity below that of the corresponding oxide. Mention may be made, for example, of the compound $TiO_x$, with x strictly less than 2. However, this degree of sub-stoichiometry is normally limited to 15% maximum, and preferentially 10% maximum, so as to limit the supply of oxygen subsequently required in the magnetron. By way of example, mention may be made for $TiO_x$ of a value of x greater than or equal to 2×0.85, i.e. 1.7, preferably greater than 2×0.9, i.e. 1.8.

Various embodiments of the target according to the invention are given below:

According to a first possible embodiment for producing the targets according to the invention, a technique of thermal spraying is used, and in particular of plasma spraying, which process may be performed under an atmosphere of air or of a neutral gas. The plasma torch (propellant) used may be of the DC or RF type, and the plasma-generating gases may be binary mixtures of the (A-B) type in which A=Ar or $N_2$ and B=$H_2$, He or $N_2$ (the use of pure $N_2$ being among the possible combinations), or ternary mixtures of the (A-B-C) type in which A=Ar; B=$N_2$ or $H_2$; C=He. The various variants of hot-cathode DC torches with stabilization of the plasma by cascade technology (with neutrodes), three-cathode DC torches, DC torches combining three plasmas converging in a nozzle, and water-stabilized plasma torches may be used as means for constructing the target.

Cold-cathode torches of thermal plasma generator type also fall within the context of the present invention. These generators generally use air as plasma-generating gas, but can also function with the binary or ternary mixtures mentioned previously.

Other thermal projection methods such as the HVOF (high-velocity oxyfuel) process or the dynamic cold spray process may also be used to produce targets according to the invention.

The mixture for feeding the spraying device may in particular be a mixture of particles of a metal Me, preferably silver, in a purity of greater than 99%, preferably greater than 99.9%, preferably greater than 99.95% by weight and particles of an oxide of at least one element M, preferably the element Ti, said oxide being sub-stoichiometric in oxygen according to a molar proportion which may be up to 15%, preferentially up to 10%, so as to limit the supply of oxygen subsequently required in the magnetron during the use of the target.

To illustrate the use of these families of processes for producing the targets according to the invention, two implementation examples are illustrated below.

IMPLEMENTATION EXAMPLE NO. 1: FLAT TARGET WITH ME=AG AND M=TI

This implementation example according to the invention relates to the preparation of a flat target, formed from a combination of sub-stoichiometric titanium oxide $TiO_x$ (with x=1.95) and of silver particles, the two constituents being distributed in the microstructure homogeneously, said target being intended to be used in magnetron sputtering in AC, DC or RF mode.

This flat $TiO_x$—Ag target was produced by the plasma spraying process described previously after optimization of the distribution of the various materials in the plasma jet. The main steps of the process are as follows:
- Production of the intermediate support plate (tile) by machining, intended to be subsequently brazed on the target support.
- Preparation of the surface of the support plate by abrasive spraying (alumina-zirconia AZ grit 24).
- Deposition of a bonding underlayer by plasma spraying of a CuAl alloy (90% by mass of Cu), about 150 μm thick.
- Premixing of TiOx and Ag powders in proportions calculated as a function of the differential yields (57.3% by mass of TiOx and 42.7% by mass of Ag). The mixture is stirred (in a Turbula mixer) systematically for 1 hour. The powders used for preparing the target are powders respectively having the following characteristics:

$TiO_x$ powder: Powder of ground molten $TiO_x$ type (x=1.98) with a particle size ($d_{50}$) of 75 μm and a purity of 99.7%

Silver powder produced by atomization of liquid metal, with a particle size ($d_{50}$) of 45 μm and a purity of 99.95%

Construction of the $TiO_x$—Ag active layer on the target by plasma spraying under the following conditions:

Plasma torch of DC type with a maximum power of 60 kW, placed in a chamber under air Use of cooling jets placed under the copper support plate, and also on either side of the plasma torch, and directed toward the target to control the temperature and the stresses induced during the plasma spraying.

Plasma spraying performed with the following parameters:

| Parameters | $H_2$ content (%) | Arc intensity (A) | Spraying distance (mm) | Material flow rate (g/min) |
|---|---|---|---|---|
| Values used | 13.4 | 450 | 120 | 80 |

Surface finishing by polishing and/or machining to obtain a roughness such that Ra<5 μm An optimized device for injecting the powder mixture allows suitable injection into the plasma without segregation of the powders in flight, making it possible to ensure homogeneous distribution of Me and of MO.

The main characteristics of the target thus produced are given below:

a. Chemical Composition:

The chemical analysis of the target thus produced corresponds to an M/Me ratio of about 0.6.

b. Electrical Resistivity

| Resistivity per unit volume measured at 20° C. by the Van Der Pauw method (ASTM F76) | <100 μΩ · cm |
|---|---| c. Me Dispersion Homogeneity in the Structure:

| Homogeneity criteria on all of the ROIs | Δ (Max – min) on mean Me content | Standard deviation on mean Me content |
|---|---|---|
| Flat target | 44% | 19% | d. Microstructure and Degree of Porosity

The evaluation of the degree of porosity by image analysis, according to the method described hereinbelow, is 1%.

The microstructure of the target obtained is illustrated by the SEM image reported in FIG. 7 of a cross section thereof, which reflects the excellent homogeneity of distribution of the silver particles in the titanium oxide.

EXEMPLARY EMBODIMENT NO. 2 rotating tubular target with Me=Ag and M=Ti This implementation example relates to a rotating tubular target, formed from a combination of sub-stoichiometric titanium oxide $TiO_x$ (with x=1.95) and of silver particles, the two constituents being distributed in the microstructure homogeneously, said target being intended to be used in magnetron sputtering in AC, DC or RF mode.

This tubular $TiO_x$—Ag target is produced by the plasma spraying process after optimization of the distribution of the various materials in the plasma jet. The main steps of the process are as follows:

Use of a support tube made of austenitic stainless steel, for instance X2CrNi18-9.

Preparation of the surface of the support tube by abrasive spraying (alumina-zirconia AZ grit 24).

Preparation of a bonding underlayer via the electric arc process (twin wire arc spraying), performed in air, bonding layer of NiAl composition (95% nickel), about 150-200 μm thick. Alternatively, the wire flame spray or projection plasma (air plasma spray) processes may also be used to produce this bonding underlayer.

Premixing of TiOx and Ag powders in proportions calculated as a function of the differential yields (62% by mass of TiOx and 38% by mass of Ag). The mixture is stirred (in a Turbula mixer) systematically for 1 hour.

The powders used for preparing the target are powders respectively having the following characteristics:

$TiO_x$ powder: Powder of ground molten $TiO_x$ type (x=1.98) with a particle size ($d_{50}$) of 75 μm and a purity of 99.7%

Silver powder produced by atomization of liquid metal, with a particle size ($d_{50}$) of 45 μm and a purity of 99.95%

Construction of the $TiO_x$—Ag active layer on the target by plasma spraying under the following conditions:

Plasma torch of DC type with a maximum power of 60 kW, placed in a chamber under air Use of cooling jets placed under the copper support plate, and also on either side of the plasma torch, and directed toward the target to control the temperature and the stresses induced during the plasma spraying.

Plasma spraying performed with the following parameters:

| | Parameters | | | |
|---|---|---|---|---|
| | $H_2$ content (%) | Arc intensity (A) | Spraying distance (mm) | Material flow rate (g/min) |
| Values used | 12.3 | 550 | 150 | 160 |

Surface finishing by polishing and/or machining to obtain a roughness such that Ra<5 μm.

An optimized device for injecting the powder mixture allows suitable injection into the plasma without segregation of the powders in flight, making it possible to ensure homogeneous distribution of Me (Ag) and of MOx (TiOx).

Essential Characteristics of the Target Thus Produced:

a. Chemical Composition:

The chemical analysis of the target thus produced corresponds to an M/Me ratio=0.92 b. Electrical Resistivity

| Resistivity per unit volume measured at 20° C. by the Van Der Pauw method (ASTM F76) | 28.5 μΩ · cm |
|---|---| c. Me Dispersion Homogeneity in the Structure:

| Homogeneity criteria on all of the ROIs | Δ (max − min) on mean Me content | Standard deviation on mean Me content |
|---|---|---|
| Tubular target | 42% | 24% | d. Microstructure and Degree of Porosity

The evaluation of the degree of porosity by image analysis, according to the method described hereinbelow, is 1%.

The microstructure of the target obtained is illustrated by the image reported in FIG. 8 below of a cross section thereof, which reflects the excellent homogeneity of distribution of the silver.

IMPLEMENTATION EXAMPLE NO. 3: TARGET FORMED FROM A TIOX PREFORM

According to a third embodiment of a process for manufacturing a target according to the invention not making use of thermal spraying, the targets according to the invention are prepared by the process described below via its main steps directed toward producing a target with M=Ti and Me=Ag and x=1.8 to 2.0):

1. Preparation of a "Preform" of the Porous $TiO_x$ Target.

The geometry of the preforms corresponds to the geometry of the segments intended to be bonded to the support plate (backing plate), namely plates, or to the support tube (backing tube), namely sleeves (hollow cylinders).

The desired degree of porosity for the preform depends on the final targeted volume content of $TiO_x$. If A % is the targeted volume content of silver in the target, then the preform $TiO_x$ has a degree of porosity of P %=A %.

For high porosity values, the preform may be, for example, a ceramic foam produced according to the techniques of the art. Alternatively, to achieve the desired porosity levels, recourse may optionally be made to the addition of a furtive material intended to act as a pore generator during the thermal sintering cycle, this furtive material possibly being, for example, a polymer. For porosity levels which are lower but which can be reached by standard sintering, the preform may be made by imperfect sintering of a block of pressed powder.

2. Impregnation of Said Preform

The porous preform or ceramic foam is impregnated with liquid Ag via one of the following methods:

- Preheating of the preform to 1000° C. followed by pouring liquid Ag onto the preform placed in a case (mold) so as to impregnate it completely
- Immersion of the preform (which is itself preheated to 1000° C.) in a bath of liquid Ag followed by extraction of the preform
- Immersion by capillarity by placing the preform above and in contact with the bath of liquid Ag so that the Ag impregnates the preform by capillarity.

3. Fixing to the Support:

After light machining to bring the segments made to the targeted perfect geometry, the segments prepared are fixed to the support (tube or plate) via the soft brazing methods usually used for fixing magnetron targets, for example the indium brazing technique.

This third embodiment, performed as stated here, will also make it possible to produce the target according to the invention with the characteristics corresponding to the criteria stated previously (resistivity, homogeneity of distribution of Me, porosity).

The measurement techniques for measuring the essential characteristics of the targets described previously are given below:

A—Methodology for Characterizing the Homogeneity of Distribution of the M Oxide and Metal Me Phases in the Structure of the Target:

The methodology for characterizing the homogeneity of distribution of the M oxide phase, on the one hand, and the metal Me phase, on the other hand, are illustrated in the particular case of a target with M=Ti and Me=Ag. The element M is introduced in the form of sub-stoichiometric titanium oxide $TiO_x$ (with x=1.95) and the element Me in the form of metallic silver particles.

It is thus a matter of characterizing the homogeneity of distribution of these two phases present.

To ensure the homogeneity of distribution of these two phases present, a sample representative of the microstructure of the target in its entirety is analyzed via an image analysis protocol which makes it possible to map the presence of Me within the microstructure of the sample. The representative sample must be sampled in a representative zone of the target, encompass the entire thickness of the target and have side dimensions of a few mm. The analysis protocol is applied on images of the microstructure of the target in cross section, images taken on the representative sample with a magnification of ×200 or even, preferentially, ×100 so as to cover a wider zone.

Zones of analysis (or ROI, Region Of Interest) having the same areas (for example 100×100 µm², ideally 70×70 µm²), and which are uniformly distributed on the analysis screen are defined (see image 1). This screen, endowed with the definitions of the ROIs thus made, will act as an analysis grille on the microstructure images taken and presented facing this grille. In order thus to cover all of the microstructure sample representative of the whole target, a succession of translations is applied to successively position a sufficient number of images facing the analysis grille. Grayscale thresholding may then be applied to detect the metal phase Me (which is lighter in optical microscopy) and to determine the content thereof per unit area. The operation is repeated on at least 10 different images, taken from the target in cross section. Thus, for each ROI, a minimum of 10 images will be analyzed, which thus makes it possible to obtain the mean of the area percentage of the Me phase per ROI and the associated standard deviations.

A target thus obtained is considered as being a sufficiently homogeneous structure according to the invention if the following conditions are met:

- the difference A between the measured maximum content of Me phase and the measured minimum content of Me phase (counted on all of the ROIs chosen randomly) less than 50%, ideally less than 40% of the nominal contents T of Me phase (i.e. the mean content of Me observed on all the ROIs)
- preferably, the overall standard deviation calculated on the total number of measurements (=number of ROIs x number of images) less than 25% of the content T.

The images obtained illustrate the positioning of the ROIs and the detection of the Me phase is performed by grayscale thresholding.

Case of a Target with Non-Homogeneous Distribution:

To evaluate the pertinence of this protocol, analyses were performed by applying this homogeneity characterization protocol on various tests of preparation of targets of MOx-Me type having very different homogeneities of distribution of Me within the MOx.

Table 7 reports the area contents of Me (silver) per ROI and the associated standard deviations, the criteria identified above (Δ and standard deviations) of such targets, which make it possible to reflect the homogeneity of distribution.

TABLE 7

| Homogeneity criteria on all of the ROIs | Δ (max − min) on mean Me content | Standard deviation on mean Me content |
|---|---|---|
| Sample Test A | 69% | 37% |
| Sample Test B | 121% | 53% |

B— Measurement of the Degree of Porosity

Evaluation of the degree of porosity is performed fire the standard image analysis techniques using images obtained by electron microscopy.

More precisely, the volume content of the porosities contained in the targets is determined from the measurement of the area content of these porosities by means of the stereology relationships developed by J. C. Russ, R. T Dehoff, "Practical Stereology", 2nd edition, Plenum Press, New York, 1986. Consequently, this section describes the protocol for measuring the surface content of the porosities, determined on images (at magnification ×100 to ×500) of microstructures of cross sections (metallographic cross sections).

Evaluation of this content is performed by image analysis, the main objective which is to separate the porosities from the rest of the microstructure to be able subsequently to take measurements on the characteristics of the selected parts.

More precisely, the analysis comprises several successive steps to be applied to each representative sample of the target, which has been polished beforehand:

Acquisition of the images to be analyzed using acquisition software, coupled with an optical microscope and high-resolution camera assembly. The images are preferentially taken in grayscale.

Selection of the working zone which will define the area of the sample on which the measurements will be taken.

Binarization of the image by thresholding, which consists in conserving from the initial image only the pixels whose grayscale is between two predetermined thresholds. Given that the pixels representative of the porosity are very dark, the lower level may be chosen equal to 0. It then remains to set the upper threshold value, generally interactively, by using a representative histogram of the distribution of the pixels according to their grayscale value (from 0, black, to 255, white). The conserved pixels representative of the porosity are then coded as black (0) and the others as white (1) and give a binary image.

Determination of the area content of the porosities relative to the area of the pixels coded as black (0) representative of the porosity on the area of the working zone. This value can be calculated automatically by the image analysis software.

The mean porosity content finally retained according to the invention is the mean value of the porosity contents obtained on a sufficient number of microstructure images taken randomly (5 to 10 images) via the method described previously.

A cathode sputtering target for performing the present invention is formed, on the one hand, from an oxide of at least one element chosen from the group of titanium, silicon and zirconium and, on the other hand, of particles of a metal included in the group formed by silver, gold, platinum, copper and nickel or particles of an alloy formed from at least two of these metals, the M/Me atomic ratio in said target being less than 1.5, M representing all of the atoms of the elements of said group of titanium, silicon and zirconium present in said layer and Me representing all of the atoms of the metals of the group formed by silver, gold, platinum, copper and nickel present in said layer.

Preferred characteristics for the targets for performing the present invention are given below, and may, of course, be combined together, where appropriate:

the M/Me atomic ratio is less than 1.2, especially less than 1.0 and very preferably less than 0.8.

M represents a single element.

Said oxide is a titanium oxide of formula $TiO_x$, with $x \leq 2$, in particular a titanium oxide of formula $TiO_x$, with $x<2$ and more preferably in which $1.70<x<2.0$.

The metal is silver, gold or platinum, copper or nickel; more preferably, the metal is silver, gold or platinum and, very preferably, it is silver.

The target is made of a mixture of titanium oxide and of silver particles, the Ti/Ag atomic ratio in said target being less than 1.5, preferably less than 1.4, more preferably less than 1.0 and very preferably less than 0.8 or even less than 0.6.

The electrical resistivity, as measured according to standard ASTM F76, is less than 5 Ω·cm.

The porosity is less than 10%.

The distribution of Me relative to M is such that the difference D between the maximum content of Me phase measured in said target and the minimum content of Me phase measured in said target, on a plurality of analysis zones of the same area $70 \times 70$ μm$^2$, is less than 50%, preferably less than 40%, of the mean content of Me phase measured on said target.

The global standard deviation calculated on the total number of measurements is less than 25% of the mean content of Me phase measured on said target.

The invention claimed is:

1. A glazing, comprising:
   a glass substrate on which is deposited a coating comprising a layer, the layer comprising metal nanoparticles dispersed in an inorganic matrix of an oxide,
   wherein the metal nanoparticles comprise silver, gold, platinum, copper, and/or nickel metal,
   wherein the matrix comprises an oxide comprising titanium, silicon, and/or zirconium, and
   wherein an atomic ratio M/Me in the layer is less than 1.5, M representing all atoms of titanium, silicon, and zirconium present in the layer, and Me representing all silver, gold, platinum, copper, and nickel atoms in the layer,
   wherein the metal nanoparticles are distributed in the layer in an increasing concentration gradient, from each surface of the layer to a center of the layer, the concentration of metal nanoparticles being at a maximum at the center of the layer.

2. The glazing of claim 1, wherein the material has a plasmon absorption peak whose maximum is in a range of from 350 to 800 nm.

3. The glazing of claim 1, wherein the metal atoms Me are present in a range of from 20 to 50% of all of the atoms M, Me, and O present in the layer.

4. The glazing of claim 1, in which the atoms of M together are in a range of from 10 to 40% of all of the atoms M, Me, and O present in the layer.

5. The glazing of claim 1, wherein the layer has a thickness in a range of from 5 to 100 nm.

6. The glazing of claim 1, wherein the inorganic matrix comprises titanium oxide TiOx, with $1 \leq x \leq 2$.

7. The glazing of claim 1, wherein the metal is silver.

8. The glazing of claim 1, wherein the metal nanoparticles have a globular form, and
wherein the metal nanoparticles have an average longest dimension, measured by transmission electron microscopy (TEM), in a range of from 2 to 20 nm.

9. The glazing of claim 1, further comprising:
an overlayer deposited onto the layer, relative to the glass substrate,
wherein the overlayer comprises a dielectric material.

10. The glazing of claim 1, wherein a dielectric material constituting an overlayer comprises a silicon and/or aluminum nitride.

11. The glazing of claim 9, wherein the dielectric material comprises an oxide comprising silicon, titanium, zinc, and/or tin.

12. The glazing of claim 1, further comprising:
an underlayer deposited under the layer, relative to the glass substrate,
wherein the underlayer comprises a dielectric material.

13. The glazing of claim 1, wherein a dielectric material constituting an underlayer comprises a silicon, and/or aluminum nitride.

14. The glazing of claim 12, wherein the dielectric material comprises an oxide comprising silicon, titanium, zinc, and/or tin.

15. A process for depositing a layer of a material having a plasmon absorption peak whose maximum is in a range of from 350 to 800 nm onto a glass substrate, the process comprising:
(a) passing the substrate into a cathode sputtering vacuum deposition device;
(b) introducing a plasma-generating gas into the vacuum deposition device and generating a plasma from the gas;
(c) simultaneously sputtering in the same chamber of the vacuum deposition device:
a first target comprising an oxide comprising titanium, silicon, and/or zirconium,
a second target comprising (i) an oxide comprising titanium, silicon, and/or zirconium and (ii) metal nanoparticles comprising silver, gold, platinum, copper, and/or nickel metal the second target having an M/Me atomic ratio of less than 1.5, M representing all atoms of titanium, silicon, and zirconium, and Me representing all atoms of silver, gold, platinum, copper, and/or nickel metal, the sputtering being obtained by the plasma; and
(d) recovering a glazing comprising the substrate covered with the layer, the layer comprising the metal nanoparticles dispersed in an inorganic matrix of the oxide and having a plasmon absorption peak in the visible range, or
(d') recovering a glazing comprising the substrate covered with the layer, at least the layer being heat-treated, under conditions suitable for obtaining a layer comprising the metal nanoparticles dispersed in the inorganic matrix of the oxide and having a plasmon absorption peak in the visible range,
wherein the metal nanoparticles are distributed in the layer in an increasing concentration gradient, from each surface of the layer to the center of said layer, the concentration of metal nanoparticles being at a maximum at the center of the layer,
wherein the layer has an M/Me atomic ratio of less than 1.5.

16. The process of claim 15, wherein the elements of the oxide of the first target and of the oxide of the second target are identical.

17. The process of claim 16, wherein the oxide of the first target and of the second target is titanium oxide.

18. A process for depositing a layer of a material having a plasmon absorption peak whose maximum is in a range of from 350 to 800 nm onto a glass substrate, the process comprising:
(a) passing the substrate into a cathode sputtering vacuum deposition device;
(b) introducing a plasma-generating gas into the vacuum deposition device and generating a plasma from the gas, in the presence of oxygen;
(c) sputtering a target in a chamber of the device, the target comprising (i) an oxide comprising titanium, silicon, and/or zirconium, and (ii) particles comprising silver, gold, platinum, copper, and/or nickel metal, the target having an M/Me atomic ratio of less than 1.5, M representing all atoms of titanium, silicon, and zirconium, and Me representing all atoms of silver, gold, platinum, copper, and nickel, the sputtering being obtained using the plasma; and
(d) recovering a glazing comprising the substrate covered with the layer, the layer comprising the metal nanoparticles dispersed in an inorganic matrix of the oxide and having a plasmon absorption peak in the visible range, or
(d') recovering a glazing comprising the substrate covered with the layer, and at least the layer being heat-treated, under conditions suitable for obtaining the layer comprising the metal nanoparticles dispersed in the inorganic matrix of the oxide and having a plasmon absorption peak in the visible range,
wherein the metal nanoparticles are distributed in the layer in an increasing concentration gradient, from each surface of the layer to a center of the layer, the concentration of metal nanoparticles being at a maximum at the center of the layer.

19. The process of claim 18, wherein the oxide of the target comprises titanium oxide.

20. The process of claim 18, wherein the metal is silver, gold, or platinum.

21. The process of claim 18, wherein the gas from which the plasma is generated is a neutral gas comprising argon, krypton, or helium, alone or as a mixture.

22. The process of claim 18, wherein the process comprises, during the recovering (d'), heating the substrate up to a temperature above 400° C. and below a softening point of the glass substrate.

23. The process of claim 18, wherein the metal is silver.

* * * * *